United States Patent
Bouny

(10) Patent No.: US 7,221,221 B2
(45) Date of Patent: May 22, 2007

(54) POWER AMPLIFIER WITH PRE-DISTORTER

(75) Inventor: Jean-Jacques Bouny, Fontenilles (FR)

(73) Assignee: Freescale Semiconductor, Inc., Austin, TX (US)

( * ) Notice: Subject to any disclaimer, the term of this patent is extended or adjusted under 35 U.S.C. 154(b) by 92 days.

(21) Appl. No.: 10/517,454

(22) PCT Filed: May 23, 2003

(86) PCT No.: PCT/EP03/05504

§ 371 (c)(1),
(2), (4) Date: Nov. 30, 2004

(87) PCT Pub. No.: WO03/103136

PCT Pub. Date: Dec. 11, 2003

(65) Prior Publication Data

US 2005/0212594 A1     Sep. 29, 2005

(30) Foreign Application Priority Data

May 30, 2002   (EP)   ................................. 02291330

(51) Int. Cl.
  *H03F 1/26*   (2006.01)
(52) U.S. Cl. .................. 330/149; 330/53; 330/302
(58) Field of Classification Search ................ 375/397
  See application file for complete search history.

(56) References Cited

U.S. PATENT DOCUMENTS 5,412,354 A  *  5/1995  Quan ........................ 333/121
5,568,087 A  *  10/1996  Gatti ........................ 330/149
6,211,734 B1 *  4/2001  Ahn ........................ 330/149
6,255,908 B1 *  7/2001  Ghannouchi et al. ....... 330/149
6,731,168 B2 *  5/2004  Hedberg et al. ............ 330/149

FOREIGN PATENT DOCUMENTS

EP       0844732 B1    5/1998

* cited by examiner

*Primary Examiner*—Robert Pascal
*Assistant Examiner*—Alan Wong

(57) ABSTRACT

Amplifier apparatus comprising a power amplifier (4) having an operating frequency in the radio frequency ('RF') or microwave or higher ranges and a pre-distorter (2), the characteristics of the power amplifier (4) comprising a distortion from a linear transfer function. The pre-distorter (2) comprises a non-linear path (7), a linear path (8), input means (6) responsive to an amplifier input signal for applying respective prre-distorter input signals to the paths (7,8) and combining means (13) for combining a linear signal from the linear path (8) with a non-linear signal from the non-linear path (7) to produce a pre-distorted signal. The characteristics of the pre-distorter (2) comprise a distortion relative to a linear transfer function such as to tend to compensate for the distortion of the transfer function of the power amplifier. The input means (6) is arranged to apply the pre-distorter input signals to the paths (7,8) substantially in relative phase opposition (+90) and the combining means (13) is arranged to combine the signals from the paths (7,8) without introducing any significant relative phase difference. The input means (6) and the combining means (13) consist substantially of passive components (16 to 21, 30 to 36) and substantially all the components of the pre-distorter (2) are formed in a common semiconductor substrate.

9 Claims, 1 Drawing Sheet

POWER AMPLIFIER WITH PRE-DISTORTER

FIELD OF THE INVENTION

This invention relates to a power amplifier having an operating frequency in the radio frequency ('RF') or microwave or higher ranges, with a pre-distorter. Such a power amplifier is referred to below as a radio power amplifier.

BACKGROUND OF THE INVENTION

Radio power amplifiers are used in telecommunications, for example, both for transmission and for reception. To operate a power amplifier efficiently, with maximum power gain, it is desirable to run it with bias voltage and input signal amplitude conditions such that it functions close to saturation, with the consequence that the linearity of its transfer function is degraded or distorted relative to an otherwise similar amplifier running further from saturation.

Radio power amplifiers that are made using monolithic integrated circuit ('MIC') technology are conveniently linearised by a pre-distorter using a scaled device of the same MIC technology as the power amplifier. Such a pre-distorter presents to the input signal a non-linear transfer function that tends to compensate the non-linearities in the operation of the power amplifier.

Many ways of building pre-distorters have already been described and many of them use a "linear/non-linear path" topology. One linear/non-linear path topology is described in U.S. Pat. No. 4,992,754 (Blauvelt & Loboda, assigned to Ortel corp., USA), and comprises a first path providing a copy of the input signal (linear path), and a second path in which some distortion is introduced through a non-linear device (non-linear path). The difference between the signals from the two paths contains a distortion that is arranged to be in opposition with the distortion of the power amplifier to linearise, in order to cancel out the distortion introduced by the power amplifier.

One limitation of the system described in that patent specification is that some delay must be introduced in the linear path to compensate for the delay in the non-linear path, and the relationship between the two paths in phase and amplitude is not easily maintained with frequency and from part to part. Another limitation is in the couplers, which may be well suited for hybrid technology but which are not easy to integrate, especially on semiconductor material such as Silicon where transmission lines are lossy.

U.S. Pat. No. 5,576,660 (Pouysegur & Nicolas assigned to Alcatel Espace, France) describes a pre-distorter using a linear/non-linear path topology with similar devices in the two paths. This helps a lot for frequency response because the electrical lengths (that is to say the phase difference between the input and output) of the two paths are similar and the characteristics of certain components of the pre-distorter vary in a similar manner with frequency and temperature. However, the pre-distorter comprises a 90° input divider and a 90° output coupler in hybrid form; the circuits of the two channels (or paths) are interconnected by microstrip circuits or by hybrid techniques. From the user point of view, numerous tuning operations are necessary in order to optimise the linearity of this system. Phase and gain need to be adjusted in each path to adjust the shape of the gain and phase pre-distortion curves. The bias voltages of all the active devices used in both paths need to be adjusted, and also the total gain of the pre-distorter to adjust its level characteristic to that of the power amplifier (the level at which the amplifier will start to introduce distortion).

SUMMARY OF THE INVENTION

The present invention provides amplifier apparatus comprising a power amplifier having an operating frequency in the radio frequency ('RF') or microwave or higher ranges and a pre-distorter as described in the accompanying claims.

DETAILED DESCRIPTION OF THE PREFERRED EMBODIMENTS

Figure 1:
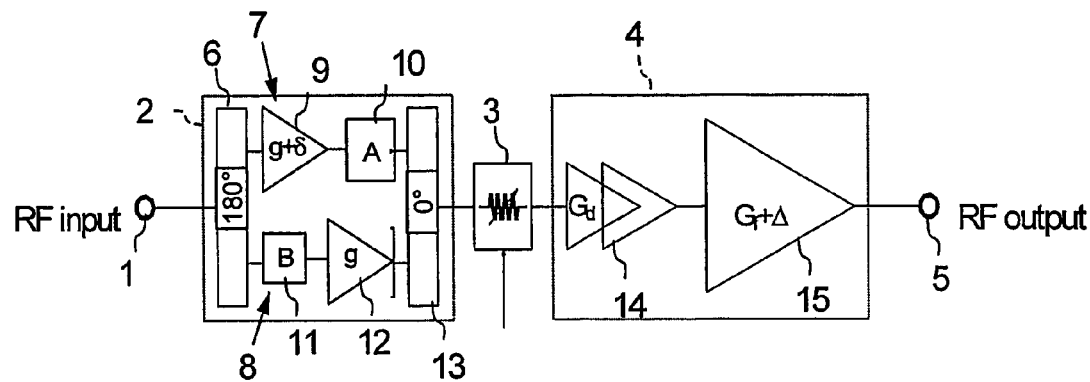
FIG. 1 is a schematic diagram of amplifier apparatus in accordance with one embodiment of the invention, given by way of example.

The amplifier apparatus shown in the drawings comprises an input terminal 1 for a radio frequency input signal, a pre-distorter 2 receiving the signal from the terminal 1, a variable attenuator 3 receiving an output signal from the pre-distorter 2 and a power amplifier 4 whose output signal is applied to an output terminal 5.

The pre-distorter 2 comprises an input divider 6 that divides the input signal from the terminal 1 into two signals of equal amplitude, which are applied respectively to a non-linear path 7 and a linear path 8. The divider 6 introduces a phase difference of 180° between the two signals applied to the paths 7 and 8 respectively. The non-linear path 7 comprises an amplifier 9 that is connected to receive the signal from the divider 6 and applies the amplified signal to an attenuator 10. The path 8 comprises an attenuator 11 that receives the signal from the divider 6 and a linear amplifier 12, to which the signal from the attenuator 11 is applied. The paths 7 and 8 are connected to apply the output signals to a coupler 13 that combines the signals from the two paths with zero phase difference between the combined signals. The coupler 13 applies the combined signal to the variable attenuator 3.

In the preferred embodiment, each of the paths 7 and 8 presents an impedance of 100 ohms and the divider 6 presents an impedance of 50 ohms to the input terminal 1 and 100 ohms to each of the paths 7 and 8.

The amplifiers 9 and 12 comprises transistors of smaller size than the transistors of the power amplifier 4 but otherwise identical to the power amplifier transistors, being manufactured with the same technological process in the same foundry.

The non-linear path amplifier 9 is operated under conditions of bias and signal voltage that are substantially equal to those of the power amplifier 4. Accordingly, the distortion characteristics of the non-linear amplifier 9 are substantially identical to those of the power amplifier 4. The linear amplifier 12 is operated at a similar bias voltage but with a signal voltage that is substantially attenuated by the attenuator 11, so that the linear amplifier 12 operates substantially with optimally linear characteristics, its gain being otherwise substantially identical to that of the non-linear path amplifier 9.

In this embodiment of the present invention, the attenuation power factor A of the attenuator 10 in the non-linear path 7 is double (or +3 dB) the power attenuation factor B of the attenuator 11 in the linear path 8. The distortions of the transfer functions cancel out if the gains g of the amplifiers 9 and 12 are equal, and the non-linearity δ of the amplifier 9 is also equal to the non-linearity Δ of the final stage 15 of the power amplifier.

In the preferred embodiment of the invention, all the components of the pre-distorter 2 are formed in a common semiconductor substrate. Moreover, components of the power amplifier 4 are also formed in the same semiconductor substrate and, in particular, all the components of the variable attenuator 3 and of the first stage 14, the driver of the power amplifier, are formed in the same semiconductor substrate. All the components of the final stage 15 of the power amplifier are are also formed in a common substrate, which is the same as that of the pre-distorter if their size permits. The technology used in the preferred embodiment of the invention for the common substrate(s) is monolithic microwave integrated circuit ('MMIC') technology. One embodiment of such an amplifier operates at a frequency of 2.14 GHz.

The pre-distorter of U.S. Pat. No. 5,576,660 includes a 90° input divider and a 90° output coupler which cannot readily be implemented in wide band IC's (Integrated circuits). In IC's, and especially on Silicon, because the transmission lines are very lossy, it is necessary to use lumped elements to built 90° couplers and they are not very wide band. The input divider of this embodiment of the present invention applies the input signal to the paths 7 and 8 substantially in relative phase opposition and the coupler combines the signals from the two paths without introducing any significant relative phase difference. This topology is readily integrated in an IC.

Figure 2:
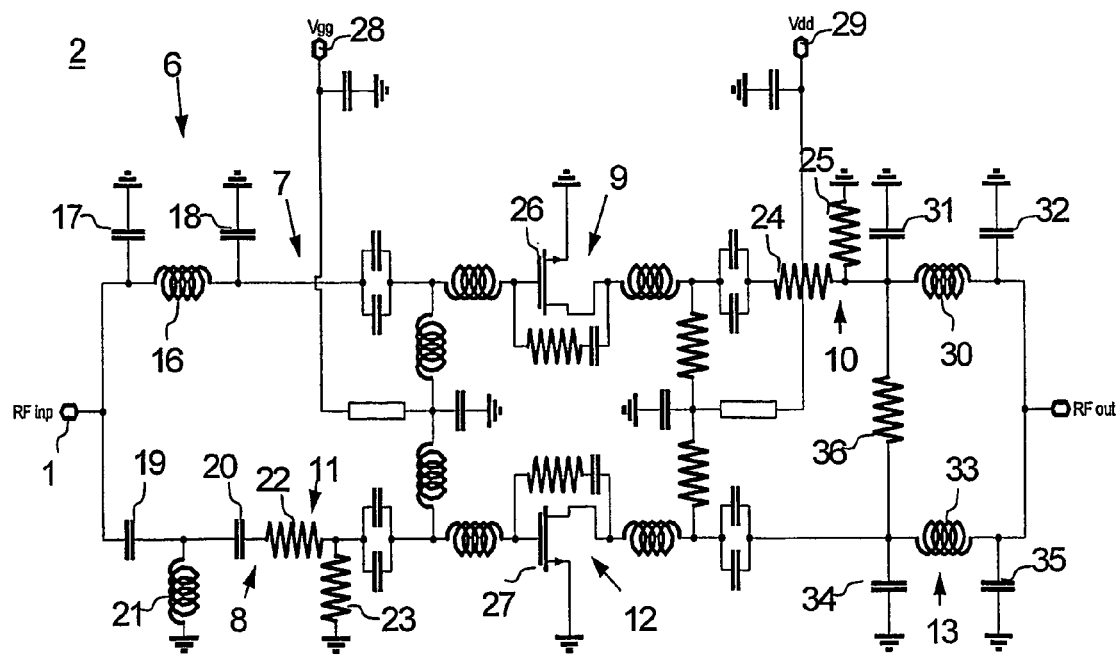
FIG. 2 is a more detailed schematic diagram of a pre-distorter in the amplifier apparatus of FIG. 1.

An additional drawback of that previous topology is that it uses small devices to create the non-linearities; these devices have very high input and output impedances and are not easy to match to the standard 50 Ohms impedance. The pre-distorter of this embodiment of the present invention is readily matched to the standard 50 Ohms impedance; linear path 8, and non-linear path 7, are individually matched to 100 Ohms, which means that input divider 6 and output coupler 13 do not provide any impedance transformation and accordingly have a wider bandwidth. Referring now to FIG. 2, the circuit of a preferred embodiment of the pre-distorter 2 is shown in more detail, by way of example. The input divider comprises an inductor 16, connected in series between the terminal 1 and the non-linear path 7, the ends of the inductor 16 being connected to ground through respective capacitors 17 and 18. The inductor 16 and capacitors 17 and 18 form a tuned circuit that introduces a phase shift of +90° between the signal at the terminal 1 and the signal applied to the non-linear path 7. The divider 6 also comprises capacitors 19 and 20, connected in series between the terminal 1 and the linear path 8, the junction of the capacitors 19 and 20 being connected to ground through an inductor 21. The capacitors 19 and 20 and the inductor 21 are tuned to introduce a phase shift of −90° between the signal at the terminal 1 and the signal applied to the linear path 8. Accordingly, the signals applied to the paths 7 and 8 have a phase difference of 180°.

The attenuator 11 comprises resistors 22 and 23, one end of the resistor 22 being connected to the capacitor 20 so that the resistor 22 is in series in the path 8 and the other end of the resistor 22 being connected through the resistor 23 to ground. The respective values of the resistors 22 and 23 are such that the attenuator 11 introduces an attenuation factor of 6 dB. The attenuator 10 comprises resistors 24 and 25, one end of the resistor 24 being connected to the output of the amplifier 9 with the resistor 24 in series in the non-linear path 7, and the other end of the resistor 24 being connected to ground through the resistor 25. The respective values of resistors 24 and 25 are chosen so that the attenuator 10 introduces an attenuation factor of 9 dB. The amplifiers 9 and 12 comprise respective transistors 26 and 27, having respective gate, source and drain terminals. As mentioned previously, the transistors 26 and 27 are of smaller size but are otherwise identical to transistors in the final stage 15 of the power amplifier 4. A gate bias voltage is applied to a terminal 28, which is connected to the gate terminals of the transistors 26 and 27, so that they are biased to the same gate bias voltage. A drain bias voltage is applied to a terminal 29, which is connected to the drain terminals of the transistors 26 and 27, so that they are biased to the same drain bias voltage. These two bias voltages are the same as applied to the transistors of the final stage 15 of the power amplifier 4. However, since the signal applied to the transistor 26 comes directly from the divider 6 without attenuation, whereas the signal applied to the transistor 27 is first attenuated by the attenuator 11, the transistor 26 operates with a signal amplitude that is non-linear in conditions identical to the final stage 15, whereas the transistor 27 operates in linear conditions. The transistors of the driver stage 14 of the power amplifier 4 also operate in linear conditions, due to the attenuation introduced by the attenuators 10 and 11.

The coupler 13 presents an impedance of 100 ohms to each of the paths 7 and 8 and an impedance of 50 ohms to the variable attenuator 3. In the path 7, the coupler comprises a tuned circuit consisting of an inductor 30 in series with the path 7, the ends of the inductor 30 being connected to ground through respective capacitors 31 and 32. An identical tuned circuit consisting of inductor 33 and capacitors 34 and 35 is connected in the path 8. The two circuits comprising inductors 30 and 33 and capacitors 31 and 32, 34 and 35 are tuned so that in each of the paths 7 and 8, they introduce a similar phase shift of 90°, so that they do not introduce any relative phase difference between the two paths.

The output ends of the inductors 30 and 33 are connected together and to the variable attenuator 3. In order to isolate the paths 7 and 8 from each other as far as feedback of RF signals is concerned, a resistor 36 is connected between the input ends of the inductors 30 and 33, to cancel such feedback.

The divider 6 and coupler 13 consist of passive, reactive components, which are readily formed in the integrated circuits of the pre-distorter. The bandwidth for operation of the pre-distorter is large, since, apart from the input divider 6, the electrical length of the paths 7 and 8 are substantially identical and use the same components, so that the response does not vary, due to process variables (that is to say, from one product to another).

Since the transistors 26 and 27 are identical to the corresponding transistors of the power amplifier 4, exactly the same kind of non-linearity is obtained, without phase or amplitude tuning in the two paths 7 and 8. Also, the thermal behavior of the pre-distorter is similar to that of the power amplifier 4 and no adjustment of the characteristics with temperature is required.

It will be appreciated that the divider 6 and coupler 13 consist, basically, of low path and high path filters in the embodiment illustrated. Band path filters may be used instead if desired. Also, the attenuators 10 and 11 may be formed from Π or T networks if desired.

The invention claimed is:

1. Amplifier apparatus comprising a power amplifier having an operating frequency in the radio frequency ('RF') or microwave or higher ranges and a pre-distorter, the characteristics of said power amplifier comprising a distortion from a linear transfer function, said pre-distorter comprising a non-linear path, a linear path, input means responsive to an amplifier input signal for applying respective pre-distorter input signals to said paths and combining means for combining a linear signal from said linear path with a non-linear signal from said non-linear path to produce a pre-distorted signal, the characteristics of said pre-distorter comprising a distortion relative to a linear transfer function such as to tend to compensate for the distortion of the transfer function of said power amplifier, wherein said input means is arranged to apply said pre-distorter input signals to said paths substantially in relative phase opposition and said combining means is arranged to combine said signals from said paths without introducing any significant relative phase difference, wherein said non-linear path comprises a non-linear path amplifier, and a non-linear path attenuator for receiving a signal from said non-linear path amplifier, and said linear path comprises a linear path attenuator, and a linear path amplifier for receiving a signal from said linear path attenuator;

wherein said non-linear path amplifier is arranged to operate at conditions of bias voltage and signal amplitude substantially equal to those of at least a final stage of said power amplifier and said linear path amplifier is arranged to operate at smaller signal amplitude but at similar conditions of bias voltage.

2. Amplifier apparatus as claimed in claim 1, wherein said input means comprises reactive components introducing opposite phase differences of substantially +90° respectively relative to said amplifier input signal.

3. Amplifier apparatus as claimed in claim 1, wherein said input means and said combining means consist substantially of passive components.

4. Amplifier apparatus as claimed in claim 3, wherein said combining means comprises reactive components, together with a resistive component decoupling said paths.

5. Amplifier apparatus as claimed in claim 1, wherein substantially all the components of said pre-distorter are formed in a common semiconductor substrate.

6. Amplifier apparatus as claimed in claim 5, wherein components of said power amplifier are formed in said common semiconductor substrate.

7. Amplifier apparatus as claimed in claim 6, wherein substantially all the components of at least a first stage of said power amplifier are formed in said common semiconductor substrate.

8. Amplifier apparatus as claimed in claim 1, wherein the outputs of said input means and the inputs of said combining means each present an impedance substantially matched to 100 Ohms, and the input of said input means and the output of said combining means each present an impedance substantially matched to 50 Ohms.

9. Amplifier apparatus as claimed in claim 1, and comprising a variable attenuator interposed between said power amplifier and said pre-distorter.

* * * * *